June 17, 1969 A. N. SAXENA ET AL 3,450,957

DISTRIBUTED BARRIER METAL-SEMICONDUCTOR JUNCTION DEVICE

Filed Jan. 10, 1967

United States Patent Office 3,450,957

Patented June 17, 1969

3,450,957

DISTRIBUTED BARRIER METAL-SEMICONDUCTOR JUNCTION DEVICE

Arjun N. Saxena and James C. McDade, Williamstown, Mass., assignors to Sprague Electric Company, North Adams, Mass., a corporation of Massachusetts Filed Jan. 10, 1967, Ser. No. 608,378

Int. Cl. H01l 3/00, 5/00

U.S. Cl. 317—234 5 Claims

ABSTRACT OF THE DISCLOSURE

A planar metal-semiconductor junction device having low turn-on voltage is provided by forming a junction having a distribution in barrier height and width.

*Background of the invention*

The present invention relates to semiconductor devices and more particularly to planar metal-semiconductor junction devices.

Planar metal-semiconductor junction devices, such as diodes, in which a metal film forms an essentially planar junction with the semiconductive material and extends over a passivating layer to an ohmic contact, are preferred for reliability, reproducibility and ruggedness as compared to point contact devices. However, the planar construction provides a device having higher turn-on voltage and lower reverse current as compared to point contact devices. These characteristics result in a higher local oscillator power requirement when used as mixers and in a difference of R.F. and I.F. impedances so that the planar device can not be utilized as a direct replacement for the latter.

*Summary of the invention*

A metal-semiconductor junction device in accordance with the invention comprises a wafer of monocrystalline semiconductive material and a metal forming a junction having a distribution in barrier height and width.

In the preferred embodiment, the distribution is provided by a strained crystal lattice resulting from interstitially diffused atoms of the metal within the semiconductive material, and in another embodiment by varied work functions of the metal at the junction, caused by a composite of different metals in this area.

It is an object of this invention to provide a planar metal-semiconductor junction device having low turn-on voltage.

It is another object of this invention to provide a planar metal-semiconductor junction diode having electrical characteristics similar to those of the point contact diode.

*Description of the preferred embodiments*

Figure 1:
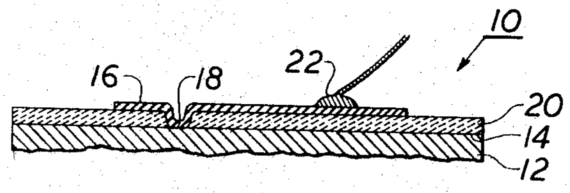
FIGURE 1 is a view in section of a metal-semiconductor junction.

Referring now to FIGURE 1, a planar junction device 10 constructed in accordance with the invention is shown. Therein, a wafer 12 of monocrystalline material, such as silicon or the like, is illustrated as having an upper surface 14 in contact with a metal film 16, thereby forming a planar metal-semiconductor junction 18. Metal films, such as gold, nickel and silver, are suitable.

A protective coating 20, of silicon oxide or the like, covers a large portion of surface 12 so as to confine the junction 18 to a small area while also protecting it from ambient conditions. A lead 22 of gold, nickel, or other suitable conductor provides an ohmic contact with the metal film, whereas connection to wafer 12 may be provided in any conventional manner, such as by alloying a suitable preform (not shown).

For the most part, conventional planar techniques are employed in this construction, with however, modifications designed to provide a non-uniform barrier at junction 18. Thus, as in conventional planar technology, a protective coat 20 is deposited by oxidation, or the like, over wafer 12. Thereafter, a small opening is made through the coating to wafer surface 14 by etching, or the like, and a metal film 16 then deposited by evaporation in a vacuum system, or chemical vapor deposition, or the like, over the oxide coating 20 and within the opening of the coating, where it contacts surface 14 and forms metal-semiconductor junction 18.

Figures 2, 3:
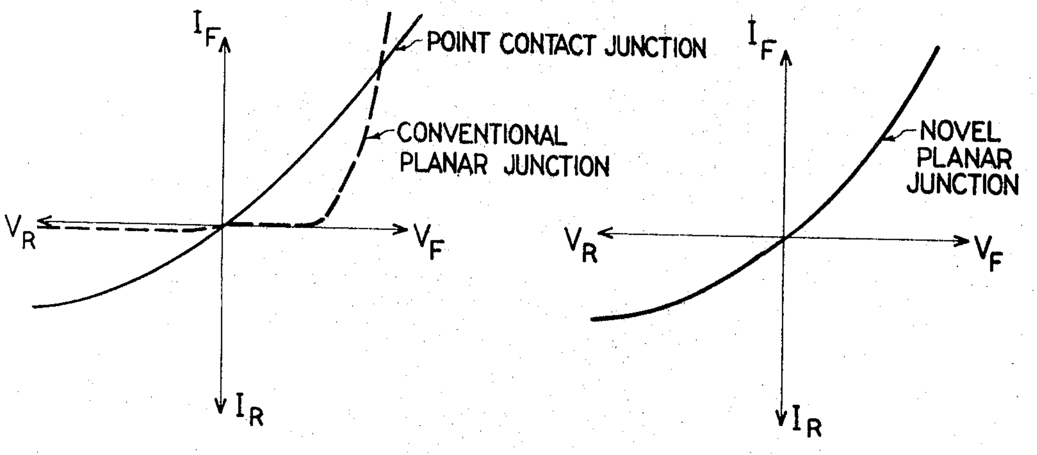
Fig. 2 Fig. 3 (PRIOR ART)
FIGURE 2 is a graph of the current versus voltage characteristics of prior art point contact and planar metal-semiconductor junctions.
FIGURE 3 is a graph of the current versus voltage characteristics of a planar metal-semiconductor junction provided in accordane with the invention.

A planar metal-semiconductor junction, constructed without the novel non-uniform barrier, will provide a current versus voltage characteristic as shown in FIGURE 2. This illustration also includes for comparison, that of the point contact construction. The current scale in the reverse direction is magnified by several orders of magnitude as compared to the current scale in the forward direction. As demonstrated by this graph, devices utilizing these junctions are not readily interchangeable since the conventional planar junction, for example, a diode, has a considerably higher turn-on voltage and lower leakage current than that of the point contact device whose characteristics are due to the exceptionally large pressure exerted at the point junction by the force applied to the whisker. Of course, a planar metal-semiconductor junction does not have such force.

A junction made in accordance with planar techniques but including inventive modifications, which ensure a distribution in barrier height and width, provdes current and voltage characterstics as shown in FIGURE 3. It can be seen from the latter, that this approaches the turn-on voltage and reverse current value of the point contact device and would be generally interchangeable with it.

In the preferred embodiment, the desired barrier distribution is provided by straining the lattice of the wafer at the interface, for example, by an interstitial diffusion of the metal atoms into the semiconductive wafer. This may be accomplished by appropriate thermal treatment of the junction, such as by raising the temperature above 500° C. to produce a shallow interstitial diffusion of metal atoms across the junction interface. This diffusion, because of the difference in atomic size, thermal expansion and crystal structure, produces a strain or otherwise exerts an internal force, or pressure, within the crystal lattice, and consequently, a distribution in barrier heights and widths similar to those found in point contact diodes.

Consequently, in contrast to the point contact diode which employs an externally applied force on the whisker the novel unit described herein utilizes an internal strain at the interface, which provides the desired barrier distribution while retaining other advantages of the planar construction.

Other means of straining the crystal lattice at the interface, or of producing the desired barrier distribution would also be applicable. For example, junction 18 may be formed with varied metal work functions by a composite of different metals in the junction area. In this case the barrier will be different for each metal, and thus, provide a distribution in height and width.

It should be noted, however, that unlike the strained crystal structure which is generally applicable to all semiconductive material, this composite metal construction, although applicable to silicon and the like where complete pinning of the Fermi level of the metal by surface states does not occur, is not applicable to semiconductive materials, such as gallium arsenide or the like, where pinning strongly occurs.

Other characteristics of the point contact diode, such as the junction capacitance, can also be provided in the planar construction as, for example, by restricting the junction area 18 to the order of 0.1 mil diameter, which is entirely feasible with present photolithographic techniques.

The novel planar metal-semiconductor junction, although most useful in the described diode construction, is also applicable to other devices where a distribution in barrier heights and widths is desired, as for example, in any device where a low turn-on voltage is useful.

Thus the indicated distributed barrier junction may be employed in various devices, and many modifications are possible without departing from the spirit and scope of the invention described herein. Thus, it should be understood that the invention is not to be limited except as in the appending claims.

What is claimed is:

1. A metal-semiconductor junction device comprising a wafer of monocrystalline semiconductive material, a metal in contact with said wafer and forming a substantially planar metal-semiconductor junction therewith, and the barrier of said junction having a random distribution in height and width.

2. A device as claimed in claim 1 wherein said metal contact is a composite of different metals providing varied metal work functions in contact with said wafer at said junction which thereby provide said distributed barrier.

3. A device as claimed in claim 1 in which the crystal lattice of said wafer is under internal stress at said interface for providing said distributed barrier.

4. A device as claimed in claim 3 wherein atoms of said metal are interstitially arranged within said wafer at said interface for providing said internal stress of said lattice.

5. A device as claimed in claim 4 wherein atoms of said metal are thermally diffused within said wafer at said interface for providing said interstitial arrangement.

References Cited

UNITED STATES PATENTS 3,349,297 10/1967 Crowell et al. ------- 317—234

JOHN W. HUCKERT, *Primary Examiner.*

M. EDLOW, *Assistant Examiner.*

U.S. Cl. X.R.

148—186; 317—235

UNITED STATES PATENT OFFICE
CERTIFICATE OF CORRECTION

Patent No. 3,450,957 June 17, 1969

Arjun N. Saxena et al.

It is certified that error appears in the above identified patent and that said Letters Patent are hereby corrected as shown below:

Column 4, after line 16 insert the following:
-- 6. A device as claimed in claim 5 including a passivating coating overlying the surface of said wafer adjacent said junction thereby sealing said junction. --. In the heading to the printed specification, line 9, "5 Claims" should read -- 6 Claims --.

Signed and sealed this 5th day of May 1970.

(SEAL)
Attest:

Edward M. Fletcher, Jr.
Attesting Officer

WILLIAM E. SCHUYLER, JR.
Commissioner of Patents